US009893151B2

(12) United States Patent
Balakrishnan et al.

(10) Patent No.: US 9,893,151 B2
(45) Date of Patent: Feb. 13, 2018

(54) METHOD AND APPARATUS PROVIDING IMPROVED THERMAL CONDUCTIVITY OF STRAIN RELAXED BUFFER

(71) Applicant: International Business Machines Corporation, Armonk, NY (US)

(72) Inventors: Karthik Balakrishnan, White Plains, NY (US); Kangguo Cheng, Schnectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/404,301

(22) Filed: Jan. 12, 2017

(65) Prior Publication Data

US 2017/0125523 A1    May 4, 2017

Related U.S. Application Data

(63) Continuation of application No. 14/745,666, filed on Jun. 22, 2015, now Pat. No. 9,660,032.

(51) Int. Cl.
*H01L 21/02* (2006.01)
*H01L 27/088* (2006.01)
(Continued)

(52) U.S. Cl.
CPC ...... *H01L 29/1054* (2013.01); *H01L 21/0245* (2013.01); *H01L 21/02507* (2013.01); *H01L 21/02532* (2013.01); *H01L 21/823807* (2013.01); *H01L 21/823821* (2013.01); *H01L 21/823871* (2013.01); *H01L 21/823878* (2013.01); *H01L 23/3677* (2013.01); *H01L 27/0924* (2013.01); *H01L 29/0653* (2013.01);
(Continued)

(58) Field of Classification Search
CPC ............. H01L 29/1054; H01L 21/0245; H01L 21/02507; H01L 21/02532; H01L 21/823807; H01L 21/823821; H01L 21/823871; H01L 21/823878; H01L 23/3677; H01L 27/0924; H01L 21/823892; H01L 29/0653; H01L 29/157
USPC ...................................................... 257/190
See application file for complete search history.

(56) References Cited

U.S. PATENT DOCUMENTS 6,407,406 B1    6/2002  Tezuka
6,597,016 B1    7/2003  Yuki
(Continued)

*Primary Examiner* — Dzung Tran
(74) *Attorney, Agent, or Firm* — Harrington & Smith; Louis J. Percello

(57) ABSTRACT

A structure includes a substrate and a strain relaxed buffer (SRB) that has a bottom surface disposed on the substrate and an opposite top surface. The SRB is formed to have a plurality of pairs of layers, where a given pair of layers is composed of a layer of $Si_{1-x}Ge_x$ and a layer of Si. The structure further includes a plurality of transistor devices formed above the top surface of the SRB and at least one contact disposed vertically through the top surface of the SRB and partially through a thickness of the SRB. The at least one contact is thermally coupled to at least one of the plurality of Si layers for conducting heat out of the SRB via the at least one of the plurality of Si layers. A method to form the structure is also disclosed.

9 Claims, 8 Drawing Sheets

(51) Int. Cl.
*H01L 29/10* (2006.01)
*H01L 21/8238* (2006.01)
*H01L 27/092* (2006.01)
*H01L 29/15* (2006.01)
*H01L 29/165* (2006.01)
*H01L 29/06* (2006.01)
*H01L 23/367* (2006.01)
*H01L 29/78* (2006.01)

(52) U.S. Cl.
CPC .......... *H01L 29/157* (2013.01); *H01L 29/165* (2013.01); *H01L 29/785* (2013.01); *H01L 21/823892* (2013.01); *H01L 2029/7858* (2013.01)

(56) References Cited

U.S. PATENT DOCUMENTS

| | | | |
|---|---|---|---|
| 7,075,133 B1 | 7/2006 | Padmanabhan et al. | |
| 7,145,167 B1 | 12/2006 | Chu | |
| 8,546,183 B2 | 10/2013 | Huang et al. | |
| 8,669,477 B2 | 3/2014 | Iwamoto | |
| 8,933,540 B2 | 1/2015 | Daubenspeok et al. | |
| 2003/0151132 A1 | 8/2003 | Crippen | |
| 2004/0157387 A1* | 8/2004 | Yi | H01L 21/8249 438/202 |
| 2004/0235228 A1 | 11/2004 | Chidambaram | |
| 2005/0167698 A1* | 8/2005 | Hisaka | H01L 29/0843 257/194 |
| 2005/0205932 A1* | 9/2005 | Cohen | H01L 21/82341 257/347 |
| 2007/0007595 A1 | 1/2007 | Hirano | |
| 2008/0111154 A1* | 5/2008 | Voldman | H01L 21/8249 257/192 |
| 2008/0296615 A1 | 12/2008 | Savage | |
| 2011/0169065 A1 | 7/2011 | Cheng | |
| 2013/0181272 A1* | 7/2013 | Rutter | H01L 29/7803 257/302 |
| 2014/0191322 A1 | 7/2014 | Botula et al. | |

* cited by examiner

METHOD AND APPARATUS PROVIDING IMPROVED THERMAL CONDUCTIVITY OF STRAIN RELAXED BUFFER

CROSS-REFERENCE TO A RELATED US PATENT APPLICATION

This patent application is a continuation application of copending U.S. patent application Ser. No. 14/745,666, filed on Jun. 22, 2015, the disclosure of which is incorporated by reference herein in its entirety.

TECHNICAL FIELD

The various embodiments of this invention relate generally to semiconductor devices and fabrication techniques and, more specifically, relate to the fabrication of semiconductor transistor devices in conjunction with a strain relaxed buffer.

BACKGROUND

Tensile strained silicon (Si) enhances electron mobility by lifting the conduction band degeneracies, reducing carrier scattering and increasing the population of carriers in sub-bands with lower transverse effective mass. A strain relaxed buffer (SRB) is an important element when fabricating strained channel CMOS transistors. As an example, a SiGe SRB can be used when growing on a Si substrate a tensile strained Si channel for nFET devices and compressively strained Ge or high Ge percentage SiGe for pFET devices. Typically a thick (e.g., about one micron) SRB layer is needed to ensure a low defect density in a channel region of the nFET and pFET devices.

However, SiGe has a lower thermal conductivity than Si. For example, the thermal conductivity of $Si_{1-x}Ge_x$ (x=0.50) is only about 10% of the thermal conductivity of pure Si. The presence of the relatively thick SiGe SRB, in conjunction with the low thermal conductivity exhibited by SiGe, results in a poor heat dissipation capability of the SRB layer that in turn can negatively impact the on-chip power budget due to difficulties in power dissipation.

SUMMARY

An aspect of the non-limiting embodiments of this invention is a structure that comprises a substrate and a strain relaxed buffer disposed on a surface of the substrate. The strain relaxed buffer has a bottom surface disposed on the surface of the substrate and an opposite top surface. The strain relaxed buffer is comprised of a plurality of pairs of layers, where a given pair of layers is composed of a layer of $Si_{1-x}Ge_x$ and a layer of Si. The structure further includes a plurality of transistor devices formed above the top surface of the strain relaxed buffer and at least one contact disposed vertically through the top surface of the strain relaxed buffer and partially through a thickness of the strain relaxed buffer. The at least one contact is thermally coupled to at least one of the plurality of the Si layers for conducting heat out of the strain relaxed buffer via the at least one of the plurality of Si layers.

Another aspect of the non-limiting embodiments of this invention is a method that comprises providing a substrate; forming a strain relaxed buffer on a surface of the substrate, the strain relaxed buffer having a bottom surface disposed on the surface of the substrate and an opposite top surface, the strain relaxed buffer being formed to comprise of a plurality of pairs of layers, where a given pair of layers is composed of a layer of $Si_{1-x}Ge_x$ and a layer of Si; forming a plurality of transistor devices above the top surface of the strain relaxed buffer; and forming at least one contact through the top surface of the strain relaxed buffer and partially through a thickness of the strain relaxed buffer, the at least one contact being thermally coupled to at least one of the plurality of the Si layers for conducting heat out of the strain relaxed buffer via the at least one of the plurality of Si layers.

A further aspect of the non-limiting embodiments of this invention is a method to operate an integrated circuit. The method includes providing at least one transistor disposed above a multi-layered strain relaxed buffer comprised of alternating layers of $Si_{1-x}Ge_x$ and Si. The method further includes removing heat generated by the at least one transistor by transporting the heat laterally, primarily through one or more of the Si layers of the strain relaxed buffer, to a thermal conduit disposed vertically in the strain relaxed buffer, and then transporting the heat vertically through the thermal conduit and away from the strain relaxed buffer towards a top surface of the integrated circuit.

BRIEF DESCRIPTION OF THE SEVERAL VIEWS OF THE DRAWINGS

FIG. 1 shows a starting structure that includes a bulk Si substrate and a multilayered SRB on a top surface;

FIG. 2 shows a first mask and a result of a first doping process;

FIG. 3 shows a second mask 20A and a result of a second doping process;

FIG. 4 illustrates the structure after removal of the second mask and the growth of a tensile Si layer in an nFET region and the growth of a compressive SiGe layer in a pFET region;

FIG. 5 shows the structure after selectively masking and etching portions of the tensile Si layer and the underlying doped PTS layer in the nFET region 14 and portions of the compressive SiGe layer and the underlying PTS layer in the pFET region to form Si fins and SiGe fins;

FIG. 6 shows the structure of FIG. 5 after a dielectric layer is formed on the top surface, a device STI is formed between the nFET region and the region 16, and after well contacts are formed into the SRB layers; and FIG. 7 shows the structure of FIG. 6 after the formation of gate structures and after the deposition of an inter-layer dielectric (ILD) layer. FIG. 7 also illustrates heat flow paths through the SRB to the well contacts.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) and chemical vapor deposition (CVD). The temperature for an epitaxial deposition process typically ranges from about 550° C. to about 900° C. Although higher temperature will typically result in faster deposition of the semiconductor material, the faster deposition may also result in crystal defects and film cracking.

It is pointed out that while certain aspects and embodiments of this invention can be employed with bulk substrates such as silicon substrates, the invention can also be realized using a semiconductor on insulator (SOI) substrate.

The embodiments of this invention provide a method and structure to form strained devices in conjunction with an SRB which has an improved thermal dissipation capability. The embodiments form thermally conductive vias in graded buffer layers that overcome the problems of heating resulting from poor thermal transport in the conventional SiGe SRB.

Figure 1:
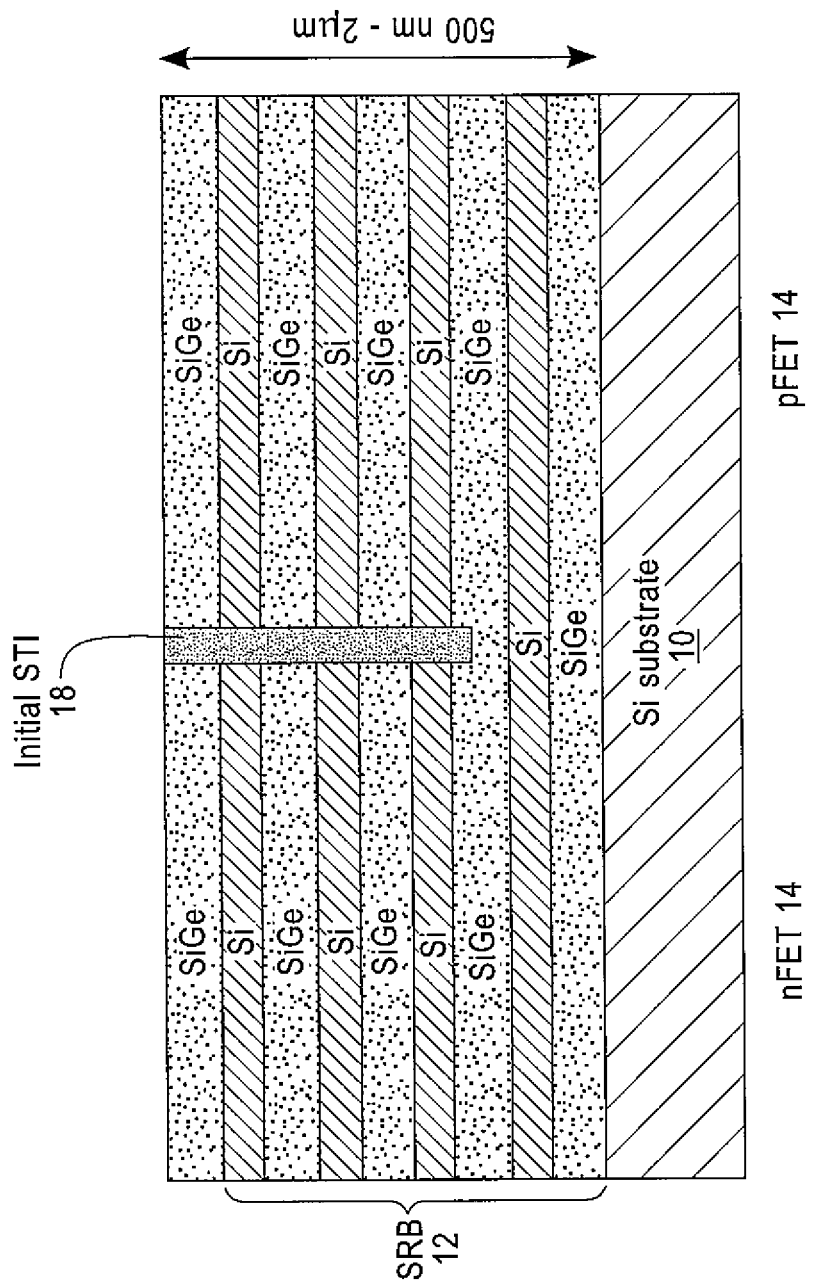
FIGS. 1-7 are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically.

Referring to FIG. 1, a starting structure includes a bulk Si substrate 10. The substrate 10 may have, for example, a {100} crystal surface and can have any desired thickness. On the surface of the substrate 10 is grown a strain relaxed buffer (SRB) 12. In accordance with an aspect of this invention the SRB 12 is grown as a plurality of alternating pairs of SiGe and Si layers. In a non-limiting embodiment there can be, for example, 5-20 layer pairs (10-40 discrete layers). The multi-layered SRB 12 can have a thickness in a range of, for example, about 500 nm to about 2 μm. As an example, and if one assumes a total SRB 12 thickness of about 500 nm and 10 layer pairs, then each individual SiGe and Si layer has a thickness of about 25 nm.

As was noted above, the Si layers have a significantly higher thermal conductivity than the SiGe layers. For example, $Si(x=0) 1.3$ W cm$^{-1}$K$^{-1}$, while $Si_{1-x}Ge_x \approx (0.046+0.084x)$ W cm$^{-1}$K$^{-1}$, $0.2 < x < 0.85$; 300 K.

Figure 8:
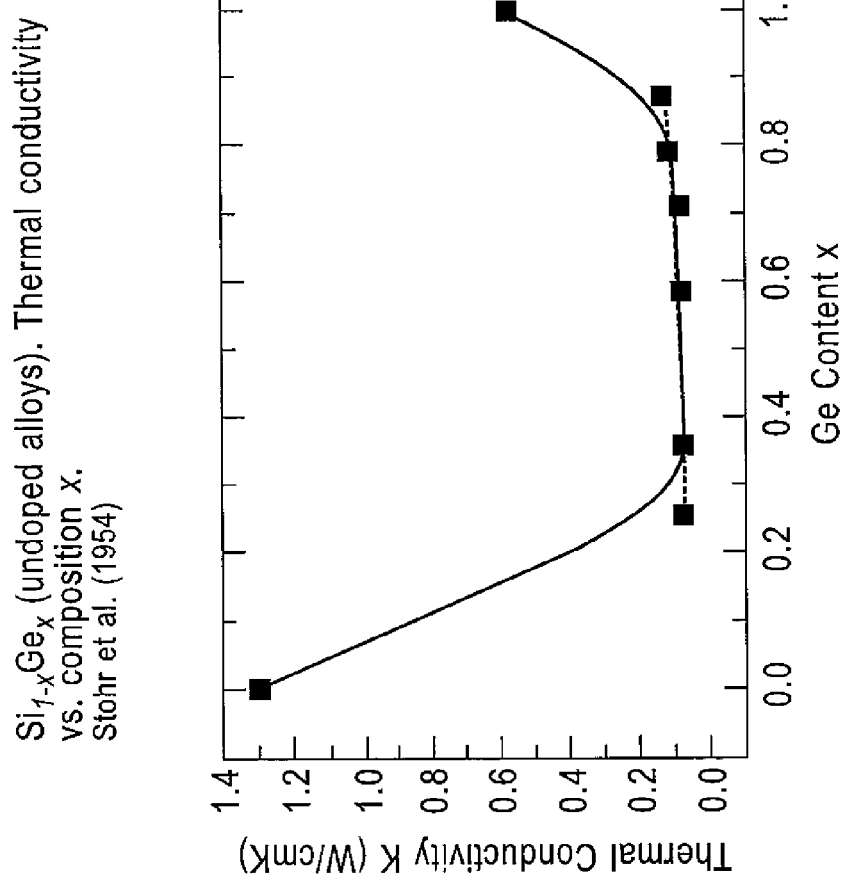
FIG. 8 is a graph that plots the thermal conductivity vs. composition x of $Si_{1-x}Ge_x$.

Reference can also be made to the graph shown in FIG. 8 that plots thermal conductivity vs. composition x of $Si_{1-x}Ge_x$.

An initial shallow trench isolation (STI) 18 can be formed by masking and etching at least partially through the SRB 12 layer stack and then growing a dielectric (e.g., an oxide) in the trench formed by the etching process. The initial STI 18 partitions the structure into what will become an nFET region 14 and a pFET region 16.

Figure 2:
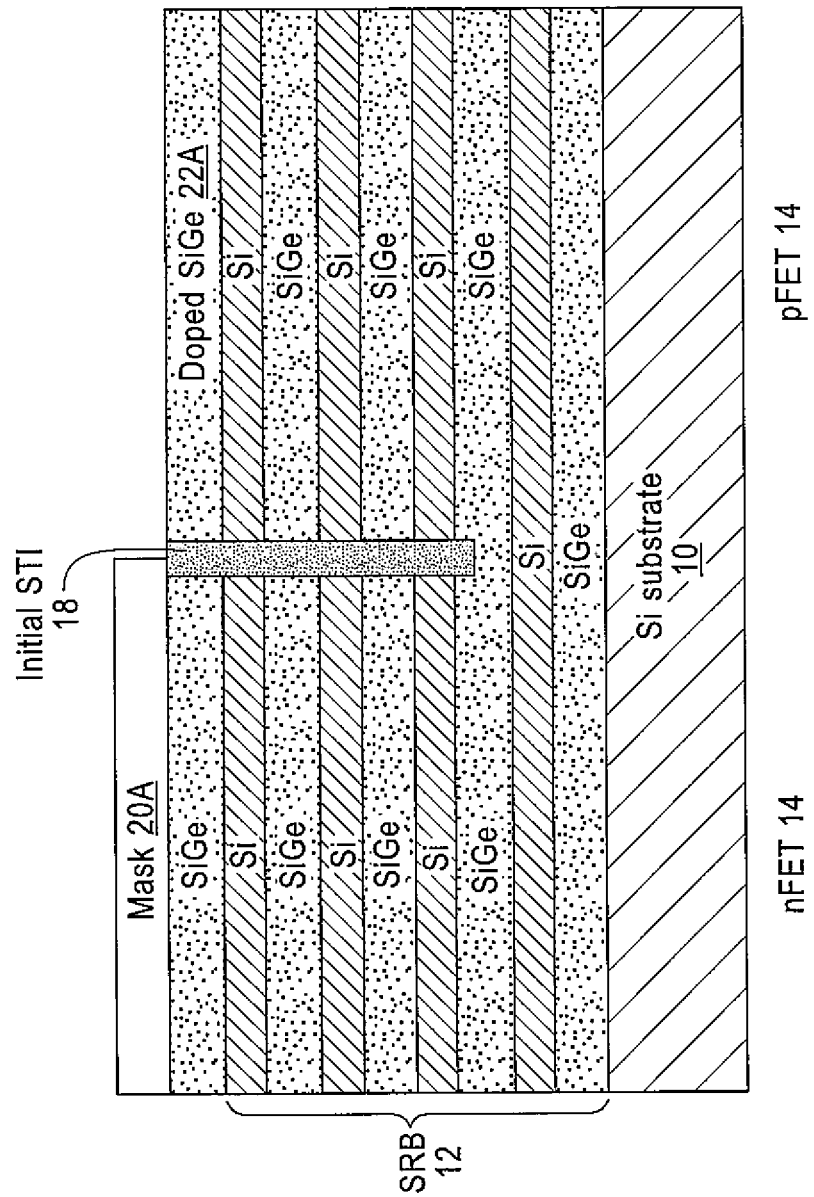

FIG. 2 shows the application of a mask 20A to cover the nFET region 14 followed by a doping process, e.g., a punch through doping (PTS) process, in the pFET region 16 to dope the top-most SiGe layer to be an N-type layer 22A. The PTS in essence provides a doped layer of opposite polarity that enhances electrical isolation of a subsequently formed fin structure. The doping process can use, for example, gas phase doping or ion implantation, and suitable N-type dopant species can be, for example, As or P.

Figure 3:
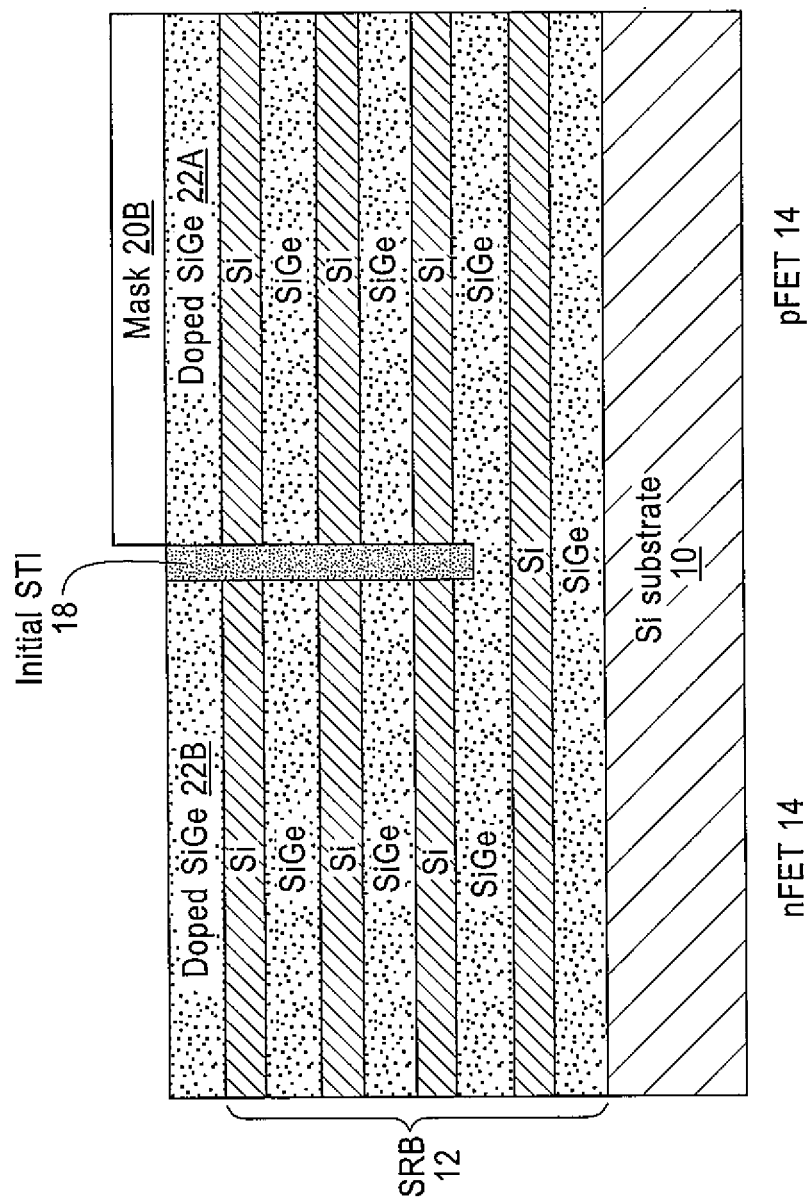

FIG. 3 shows a result of the removal of the mask 20A and the application of a second mask 20B to cover the pFET region 16. This is followed by another PTS process performed in the nFET region 14 to dope the top-most SiGe layer to be a P-type layer 22B. This doping process can also use, for example, gas phase doping or ion implantation, and a suitable P-type dopant species can be, for example, Boron.

The steps shown in FIGS. 2 and 3 could be performed in the opposite order. In FIGS. 2 and 3 an exemplary range of dopant concentration in the layers 22A and 22B can be about 5e17 to about 1e19 cm$^3$.

Figure 4:
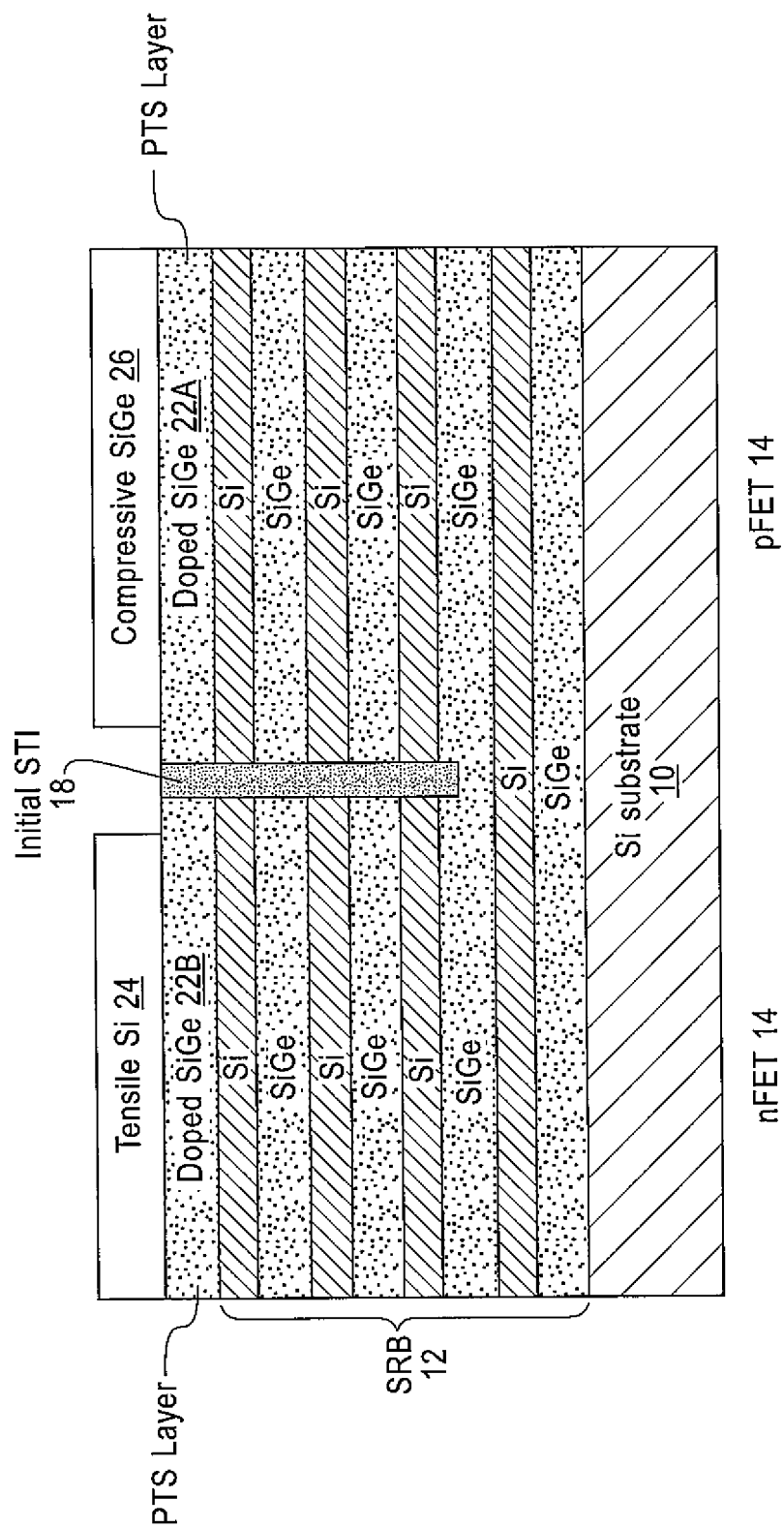

FIG. 4 illustrates the structure after removal of the mask 20B and the growth of a tensile Si layer 24 over the doped SiGe layer 22B (PTS layer 22B) in the nFET region 14 and the growth of a compressive SiGe layer 26 over the doped SiGe layer 22A (PTS layer 22A) in the pFET region 16. One suitable thickness for the tensile Si layer 24 and the compressive SiGe layer 26 is in a range of about 20 nm to about 60 nm, such as about 40 nm. The percentage of Ge in the compressive SiGe layer 26 is made greater than the percentage of Ge in the layers of the SRB 12. As a non-limiting example, if in the $Si_{1-x}Ge_x$ layers of the SRB 12 x=0.25, then in the compressive SiGe layer 26 x>0.25, e.g., x=0.30 or greater. This process can use several mask application and removal processes, and the tensile Si layer 24 and the compressive SiGe layer 26 can be grown in either order.

In this case the growth of a substantially pure (x=0) Si layer will result in the growth of a tensile stressed Si layer 24 on the doped SiGe layer 22B. Also in this case the growth of the SiGe layer 26 results in a compressive stressed layer on the doped SiGe layer 22A, assuming that in the SiGe layer 26 the value of x is made greater than the percentage of Ge in the doped SiGe layer 22.

Figure 5:
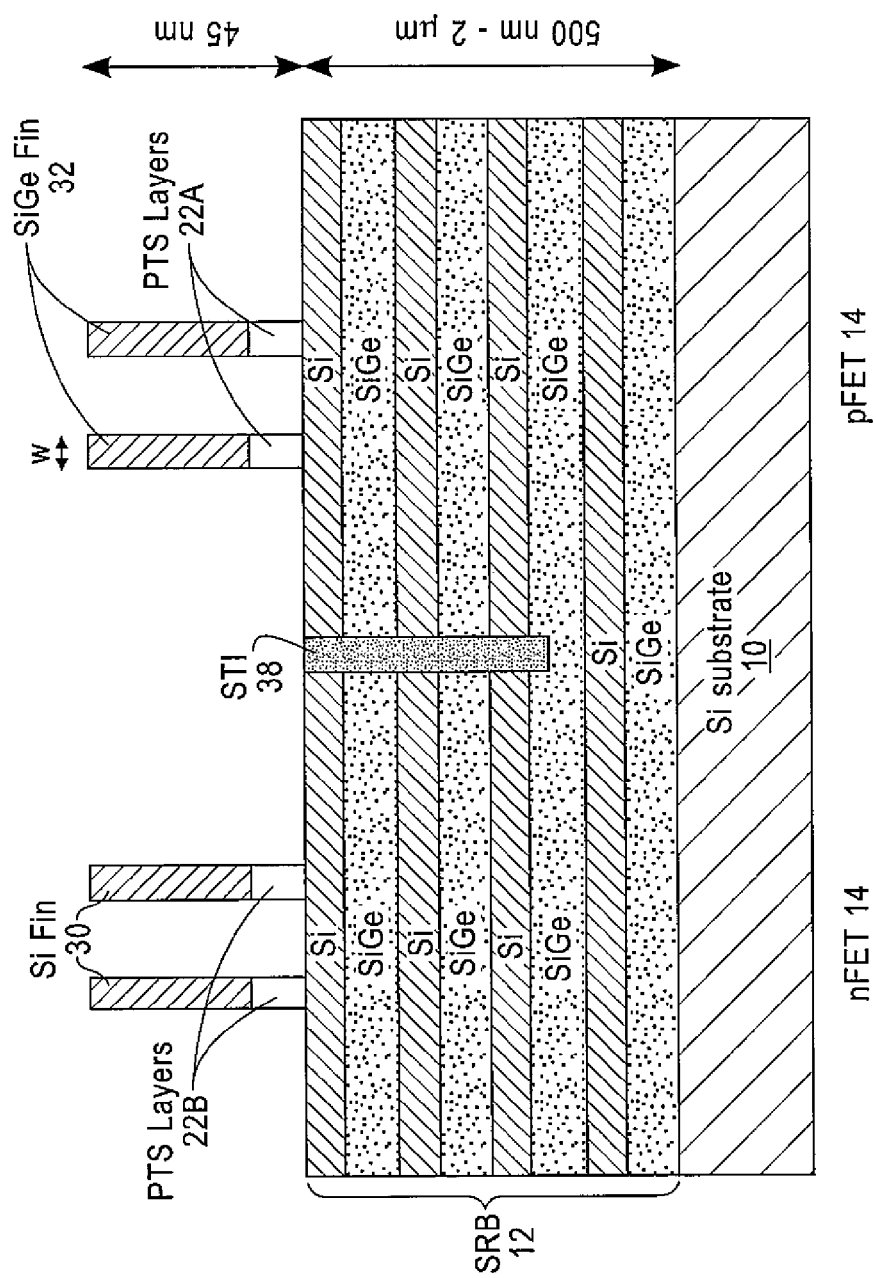

FIG. 5 shows the structure after selectively masking and etching portions of the tensile. Si layer 24 and the underlying doped PTS layer 22B in the nFET region 14, and portions of the compressive SiGe layer 26 and the underlying PTS layer 22A in the pFET region 16, thereby forming Si fins 30 and SiGe fins 32. Each of the fins 30 and 32 can have a height, relative to a top surface of the SRB Si layer beneath the PTS layers 22A and 22B, in an exemplary range of about 25 nm to about 70 nm, with 45 nm being one suitable value. Each of the fins 30 and 32 could have a corresponding width (W) in an exemplary range of about 4 nm to about 10 nm. A bottom portion of each fin includes a portion of the PTS layer 22 that is disposed on a Si layer of the SRB 12.

Figure 6:
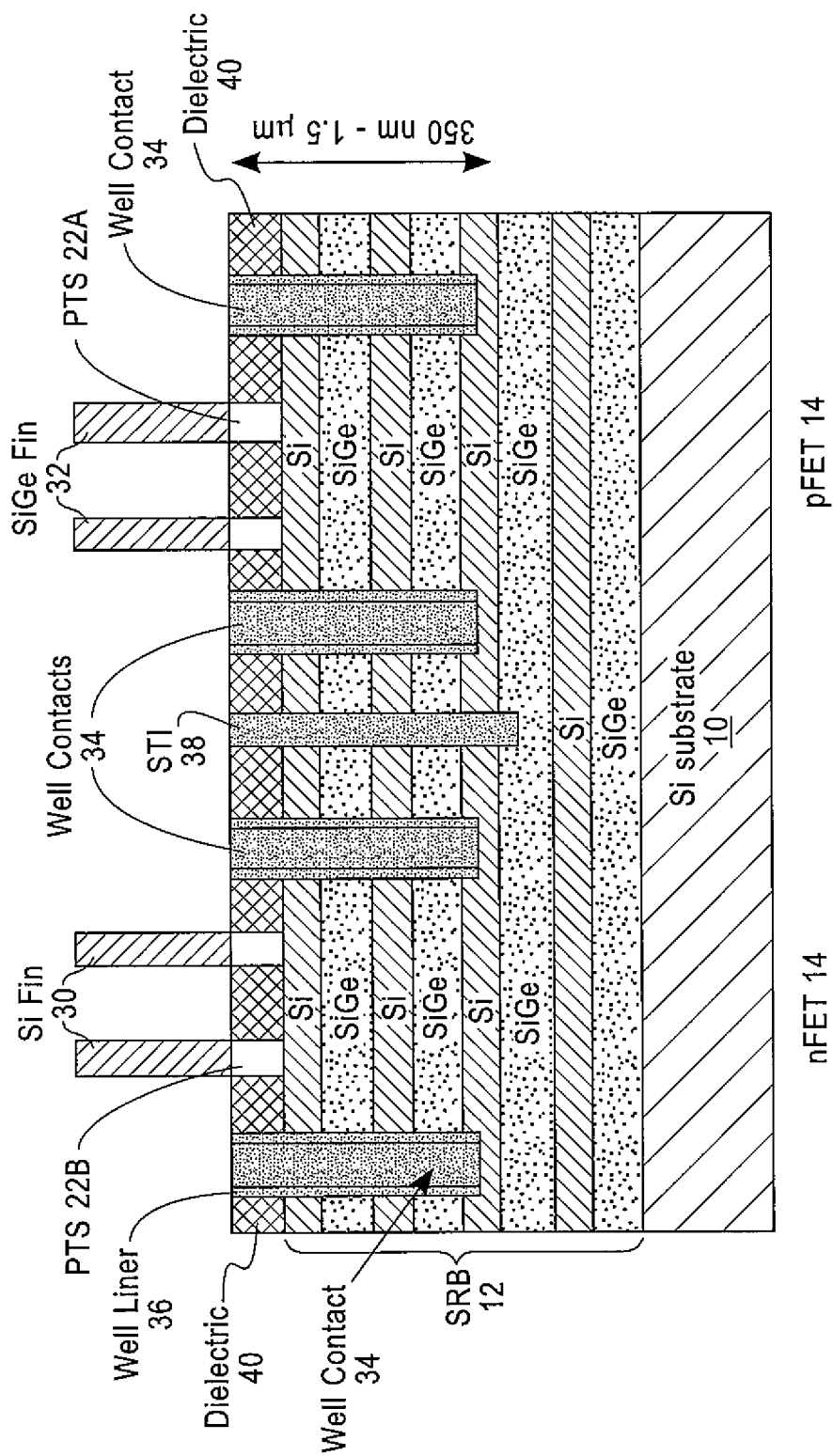

FIG. 6 shows the structure at another intermediate fabrication point. A dielectric layer 40 is formed on the top surface (e.g., a layer of oxide) and patterned. A final device STI 38 is formed between the nFET region 14 and the pFET region 16. Openings are then defined and made partially through the SRB 12 to a depth, preferably, that is less than the depth of the STI 38 in the SRB 12. The openings may be referred to for convenience as precursors to well contacts or thermal conduits wherein a dielectric liner 36 is grown (e.g., an oxide or a nitride, with TiN being one suitable material) followed by the deposition of a metal or some other material having good thermal conductivity. The completed structure is referred to for convenience in FIG. 6 as a well contact 34. The well contacts 34 can have an exemplary depth into the SRB 12, assuming a total thickness of the SRB 12 in the range of, for example, about 500 nm to about 2 µm, of about 350 nm to about 1.5 µm. Tungsten and copper are two non-limiting examples of suitable metals that can be used to form the well contacts 34. About 30 nm to about 200 nm is an exemplary width for the well contacts 34. The well contact width in a particular instantiation of this invention is generally governed by a tradeoff between an amount of desired improvement in thermal conductivity vs. the additional layout area that is consumed.

Figure 7:
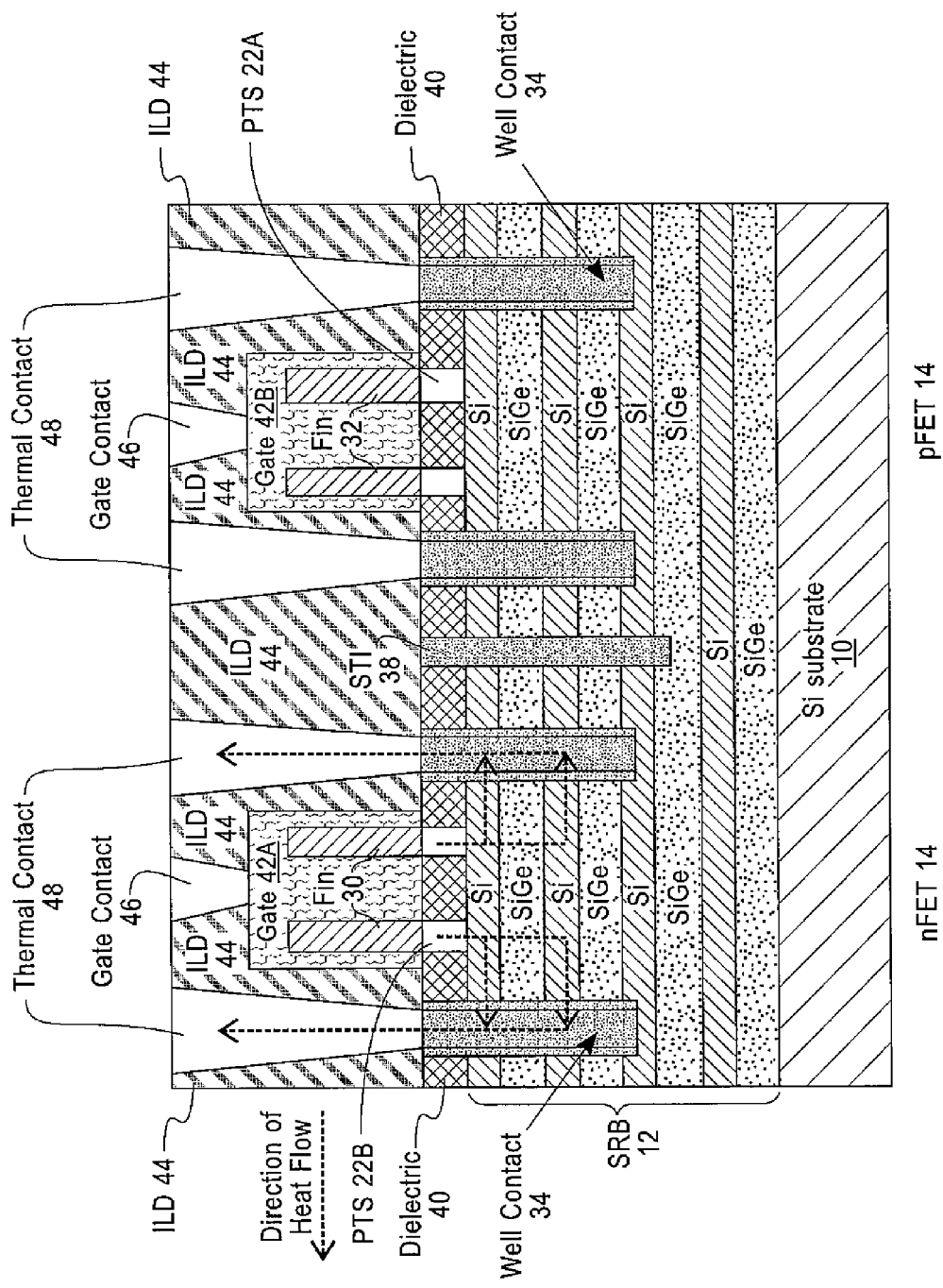

The well contacts 34 function, in accordance with aspects of this invention, as thermal conduits that enable heat, generated at least in part by operation of nFET and pFET transistors yet to be formed, to be extracted primarily via the higher (relative to the SiGe layers) thermal conductivity Si layers of the SRB 12 (exemplary heat flow paths are shown in FIG. 7).

In some embodiments the well contacts 34 may also be used electrically in the completed structure (e.g., to apply a well bias potential), and thus the electrical conductivity characteristics can also be taken into consideration along with the thermal conductivity characteristics of the selected material for the well contacts 34.

FIG. 7 shows the structure of FIG. 6 after the formation of gate structures 42A and 42B over a channel region of the fins 30 and 32 in the nFET regions 14 and the pFET region 16, respectively. The gate structures 42A and 42B can be conventional and can include a gate dielectric (e.g., an oxide or a high dielectric constant (hi-k) material) and any desired and suitable gate metal or metal system (including work function-selected metals and metal systems).

As non-limiting examples, this can be achieved by depositing a thin oxide layer (interface $SiO_2$ growth) on the fins 30 and 32 followed by gate dielectric deposition and gate metal deposition. For example, the gate dielectric can be formed as a layer of high dielectric constant (high-k) material comprising a dielectric metal oxide and having a dielectric constant that is greater than the dielectric constant of silicon nitride (7.5). The high-k dielectric layer may be formed by methods well known in the art including, for example, chemical vapor deposition (CVD), atomic layer deposition (ALD), molecular beam deposition (MBD), pulsed laser deposition (PLD) and liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the high-k dielectric layer may be from about 1 nm to about 10 nm, and more preferably from about 1.5 nm to about 3 nm. The high-k dielectric layer can have an effective oxide thickness (EOT) on the order of, or less than, about 1 nm. The gate metal can be deposited directly on a top surface of the high-k dielectric layer by, for example, chemical vapor deposition (CVD), physical vapor deposition (PVD), or atomic layer deposition (ALD). As non-limiting examples the gate metal can include a metal system selected from one or more of TiN, TiC, TaN, TaC, TaSiN, HfN, W, Al and Ru, and may be selected at least in part based on the desired work function (WF) of the device (nFET or pFET), as is known.

FIG. 7 can be considered as a cross-sectional view through the center of the gate structures 42A and 42B and thus appropriately doped source and drain regions, and corresponding source and drain contacts, that are adjacent to the gate structures (into and out of the plane of the drawing of FIG. 7) are not shown.

After forming the gate structures 42A and 42B the deposition of an inter-layer dielectric (ILD) 44 is accomplished. The ILD layer 44 is then patterned and openings are formed wherein gate contacts 46 (any conventional electrically conductive material contacts) and (at least) thermally conductive contacts 48 are formed. The thermally conductive contacts 48 are connected on a top surface to lateral metallization that can provide and/or be coupled to a heat sink structure for dissipating the heat conducted from the SRB 12.

The dotted arrows in FIG. 7 show the direction of heat flow in the structure during operation. As can be seen the heat flow from operating nFET and pFET transistors is primarily conducted out of the structure through the higher thermal conductivity Si layers of the SRB 12 to the well contacts 34 and then though the thermal contacts 48. The presence of the Si layers in the SRB 12 thus provides a means to more efficiently and rapidly remove heat from the structure, in conjunction with the contacts 34 and the thermal contacts 48. The well contacts 34 are formed to a depth in the SRB 12 that provides a desired amount of thermal coupling to the Si layers of the SRB 12. The depth can be a function of at least a number of Si layers above a bottom of the STI 38 and the thickness of the Si layers.

Although described above with reference to two well contacts 34 and two thermal contacts 48 serving a single transistor, in some embodiments there can be more or less than two well contacts 34 and two thermal contacts 48 per transistor. Furthermore, depending on the device layout it is possible for a single well contact 34 and thermal contact 48 to serve more than one transistor. Also, while the Si layers and SiGe layers of the SRB 12 were described above as having the same thickness, in some embodiments these layers can have different thicknesses. Also, it is assumed that any anneal processes performed during fabrication of the structure shown in FIGS. 1-7 do not expose the structure to an amount of heat for an amount of time that would be sufficient to cause in the SRB 12 any appreciable amount of diffusion of the Ge from the SiGe layers into the Si layers, thereby lowering the thermal conductivity of the Si layers.

It can be seen that an aspect of the embodiments of this invention is the provision of a method to operate an integrated circuit. The method includes providing at least one transistor disposed above a multi-layered strain relaxed buffer comprised of alternating layers of $Si_{1-x}Ge_x$ and Si. The method further includes removing heat generated by the at least one transistor by transporting the heat laterally, primarily through one or more of the Si layers of the strain relaxed buffer, to a thermal conduit disposed vertically in the strain relaxed buffer, and then transporting the heat vertically through the thermal conduit and out of the strain relaxed buffer towards a top surface of the integrated circuit.

In the method the value of x in the $Si_{1-x}Ge_x$ layers is non-zero and may be in an exemplary range of about 0.10 to about 0.90 or greater.

It is to be understood that the exemplary embodiments discussed above with reference to FIGS. 1-7 can be used on common variants of the FET device including, e.g., FET devices with multi-fingered FIN and/or gate structures and FET devices of varying gate width and length. In addition, the embodiments of this invention can be used with transistor devices other than FinFETs, such as with planar FETs and with bipolar transistor devices.

Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc., having thermal contacts that are formed using methods as described herein. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do, not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, metals, insulators, dopants, dopant concentrations, layer thicknesses and the like that were specifically disclosed above. Furthermore, for a FinFET embodiment of this invention any particular transistor can comprise one, two, three or more fin structures that are electrically coupled to a gate conductor. Any and all such and similar modifications of the teachings of this invention will still fall within the scope of this invention.

What is claimed is:

1. A structure, comprising:
   a substrate;
   a strain relaxed buffer disposed on a surface of the substrate, the strain relaxed buffer having a bottom surface disposed on the surface of the substrate and an opposite top surface, the strain relaxed buffer being comprised of a plurality of pairs of layers, where a given pair of layers is composed of a layer of $Si_{1-x}Ge_x$ and a layer of Si;
   a plurality of transistor devices formed above the top surface of the strain relaxed buffer; and
   at least one contact disposed vertically through the top surface of the strain relaxed buffer and partially through a thickness of the strain relaxed buffer, the at least one contact being disposed transverse to a side of a fin of at least one transistor of the plurality of transistor devices, the at least one contact being thermally coupled to at least one of the plurality of the Si layers for conducting heat out of the strain relaxed buffer via the at least one of the plurality of Si layers.

2. The structure as in claim 1, further comprising a layer of dielectric material disposed on the plurality of transistors and a thermal contact made through the layer of dielectric material and connected to the contact for conducting heat from the contact to a top surface of the structure.

3. The structure as in claim 1, where there are about 5 to about 20 pairs of layers.

4. The structure as in claim 1, where the strain relaxed buffer has a thickness in a range of about 500 nm to about 2 μm.

5. The structure as in claim 4, where the contact is comprised of a metal and is formed to a depth in the strain relaxed buffer in a range of about 350 nm to about 1.5 μm.

6. The structure of claim 5, where the contact has a width in a range of about 30 nm to about 200 nm.

7. The structure as in claim 1, where a first one of the transistor devices is an N-type FET that comprises at least one fin composed of tensile Si disposed on a first doped layer of $Si_{1-x}Ge_x$ of the strain relaxed buffer, and where a second one of the transistor devices is a P-type FET that comprises at least one fin composed of compressive $Si_{1-x}Ge_x$ disposed on a second doped layer of $Si_{1-x}Ge_x$ of the strain relaxed buffer.

8. The structure as in claim 7, where a value of x in the compressive $Si_{1-x}Ge_x$ is greater than a value of x in the layers of $Si_{1-x}Ge_x$ in the strain relaxed buffer.

9. The structure as in claim 1, where a first one of the transistor devices is an N-type FET that comprises at least one fin comprised of a layer of tensile Si disposed above a layer of $Si_{1-x}Ge_x$ that is doped P-type, and where a second one of the transistor devices is a P-type FET that comprises at least one fin comprised of a layer of compressive $Si_{1-x}Ge_x$ disposed above a layer of $Si_{1-x}Ge_x$ that is doped N-type.

* * * * *